United States Patent [19]

Lapraik

[11] 4,179,177

[45] Dec. 18, 1979

[54] CIRCUIT BOARD CONNECTOR

[75] Inventor: Scott J. Lapraik, Pleasantville, Pa.

[73] Assignee: GTE Sylvania Incorporated, Stamford, Conn.

[21] Appl. No.: 936,316

[22] Filed: Aug. 23, 1978

[51] Int. Cl.[2] ......................... H01R 13/62; H05K 1/07

[52] U.S. Cl. ................................................... 339/74 R

[58] Field of Search ............. 339/74 R, 75 M, 75 MP, 339/176 MP

[56] References Cited

U.S. PATENT DOCUMENTS

| | | | |
|---|---|---|---|
| 3,555,488 | 1/1971 | McIver et al. | 339/176 MP |
| 3,899,234 | 8/1975 | Yeager et al. | 339/74 R |
| 3,963,317 | 6/1976 | Eigenbrode et al. | 339/74 R |

*Primary Examiner*—Neil Abrams

*Attorney, Agent, or Firm*—Robert E. Walter

[57] ABSTRACT

A low insertion force connector for making electrical connection between a circuit board and an external circuit is provided. An elongated outer housing has a centrally located opening with a channel extending longitudinally along the bottom thereof. The channel bottom includes a plurality of outwardly facing ramps along the length thereof. A plurality of contacts are mounted on the housing on either side of the channel with the ends interior the housing being bowed inwardly for contacting a circuit board. An elongated cam which has a longitudinal groove on either side thereof is mounted within the channel and has a bottom surface configured to mate with the ramps of the channel. The cam is adapted to be actuated in the longitudinal direction to ride up the ramps for movement in a transverse direction. An inner housing which is mounted interior the opening of the outer housing and over the cam includes elongated upright sections forming a zone for receiving the circuit board. The upright sections include cam follower means projecting interior respective grooves and means for abutting the bowed portions which is adapted to urge the bowed portions to a position of disengagement when the cam is actuated.

10 Claims, 3 Drawing Figures

CIRCUIT BOARD CONNECTOR

BACKGROUND OF THE INVENTION

This invention relates generally to an electrical connector for printed circuit boards, and more particularly to an electrical connector wherein a low or zero insertion force is applied to the circuit board when the circuit board is inserted into the connector.

Low insertion force or zero force connectors are well known and come in a variety of configurations. Many electrical circuits are printed, or otherwise formed on either or both surfaces of an insulating substrate. The boards or substrates are inserted into receptacles which are then interconnected into other circuit devices to form complex electronic devices. The board has a plurality of conductive pads or strips on the marginal portions thereof which make contact to a "chip" or circuit in the center portion thereof.

The connector includes contacts for engaging the strips of conductive material on the board and making electrical connection with external circuit. The external circuit may be in the form of a board having a plurality of openings therein with each opening coated with an electrically conductive material. To complete the electrical connection with the printed boards, the board is inserted edgewise into a receiving zone to mechanically and electrically engage the contact points.

Since it is necessary to have many contact points for engaging the multiple conductive strips on the board, the force required to insert the board into the receptacles can be high even though the individual force exerted by one contact is low. Reduction of the force applied by the individual contacts against the circuit board permits the use of a greater number of contacts for a given insertion force.

Insertion of a board into the connector tends to wear away the terminal strips on the board and deteriorate the contacts. This may be detrimental to both the electrical and mechanical integrity of the system and this tends to reduce the useful life connector and the board. The contact and terminal wear may necessitate early replacement of the parts and contribute to expensive equipment failures.

An example of one type of known low insertion force connector can be found in U.S. Pat. No. 3,899,234 to Yeager et al. An elongated contact drive member is positioned at the bottom of an apperture and the cam is arranged to move therein. The connector is arranged for cam movement to drive the contacts into engagement with the board or drive the cams to an out of engagement position.

U.S. Pat. No. 3,478,301 to Conrad et al. utilizes a system where insertion of a printed circuit board into the receptacle actuates cam members to displace the contact members to electrical engagement with the circuit board. U.S. Pat. No. 4,021,091 to Anhalt et al. describes a connector having a hollow shell mounted over the contacts which is vertically movable within a housing. An elongated cam rod inside the outer housing is longitudinally movable to shift the shell downwardly to cam actuate the contacts.

U.S. Pat. No. 3,997,231 to Sherwood describes a connector having a camming device comprising a matched pair of blocks which urge the contacts into a circuit board engaging position when they are moved upwardly.

Accordingly, it is an object of the present invention to provide a new and improved zero or low insertion force connector for circuit boards.

Other and further objects of the present invention will become apparent from the following description.

SUMMARY OF THE INVENTION

In accordance with the present invention, there is provided a low insertion force connector for making electrical connection between a circuit board and an external circuit comprising an elongated outer housing having a centrally located opening with a channel extending longitudinally along the bottom thereof, said channel including a plurality of outwardly facing ramps along the length thereof, a plurality of contacts mounted on said housing on either side of said channel, said contacts having end portions interior said opening and bowed inwardly for contacting a circuit board and opposite end portions projecting exterior said housing for making electrical contact with an external circuit, an elongated cam having a longitudinal groove on either side thereof and a bottom surface configured to mate with said ramps and adapted to be actuated in a longitudinal direction for movement in a transverse direction, an inner housing interior said opening includes cam follower means projecting interior said grooves for providing positive engagement therewith and transverse movement corresponding to the transverse movement of said cam, said inner housing including a pair of upright sections forming a zone for receiving the circuit board, each upright section including means for abutting bowed portions on respective sides of said channel and being adapted to urge said bowed portions to a position disengaged from a circuit board when said cam is actuated.

DETAILED DESCRIPTION OF THE INVENTION

Figure 1:
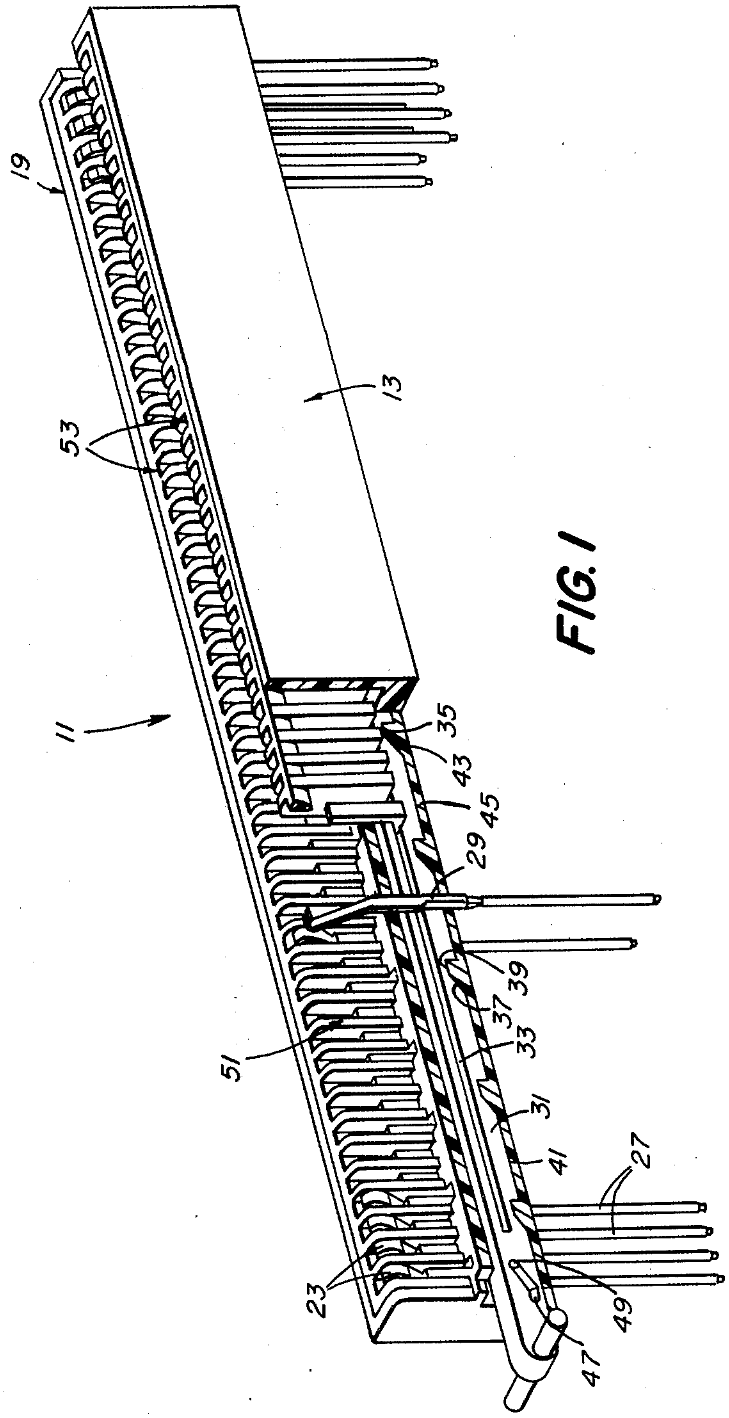
FIG. 1 is a prespective view of the connector with portions of the connector body broken away and shown in section.

As shown in FIG. 1, a connector 11 is provided for making electrical contact between a circuit board and an external circuit neither of which are shown. The circuit board generally is a conventional type integrated board having a circuit chip located in the center portion on side of the planar substrate. Leads which provide for electrical connection radiate from the chip and terminate at the edges of the substrate. Various substrates having different configurations may be utilized with the connector of the present invention.

The connector 11 generally includes an outer housing 13 having two longitudinal and substantially parallel side walls. The housing 13 is open at the ends so that a circuit board may be inserted through or into the end openings as well as into the top or centrally located opening 19. A channel 21 extends longitudinally along the bottom of the central opening 19.

A plurality of contacts 23 are mounted on the outer housing 13 on either side of channel 21. The end portions 25 of the contacts 23 positioned generally interior opening 19 are bowed inwardly for contacting a circuit board. Opposite end portions 27 project exterior the housing 13 through the bottom surface thereof and are provided for making electrical contact with an external circuit. These end portions 27 may be conveniently plugged into a mother board or even wire wrapped. Intermediate portions 29 of the contacts 23 are frictionally fitted into through bores in the housing 13 for retaining the contacts 23 in the proper position. As illustrated in the drawing, the contacts 23 are arranged in two parallel spaced apart rows with the end or bowed portions 25 of opposing rows facing each other and projecting inwardly toward the center of opening 19.

The contacts 23 can be made of any suitable material, selected for its spring-like and electrically conductive properties. Suitable materials are copper alloys. The contacts 23 which normally have the bowed portions 25 projecting inwardly for engaging a circuit board are sufficiently resilient so they can be driven outwardly.

An elongated cam 31 which has a longitudinal groove 33 on either side thereof is positioned in channel 21. The bottom surface of channel 21 includes a plurality of ramps 35 positioned along the length thereof. Each of the ramps 35 includes an inclined portion 37 and a level portion 39 at the upper end of respective ramps 35. The bottom surface 41 of the cam 31 is configured to match the bottom surface of the channel 31 and configuration of the ramps. The matching inclined portion of the cam 31 is adapted to slide upwardly along and ride up the inclined portion 37. When the cam 31 is latterally moved sufficiently far to reach the upper end of the ramps 31, further lateral movement of the cam 31 results in the mating level surface of the cam 31 at the lower end of the matching incline surface 43 engaging the level surface 39 of the ramps 35. When the cam 31 is in this latter position, positive retention of the cam in this position is provided due to the mating level surfaces.

Figure 2:
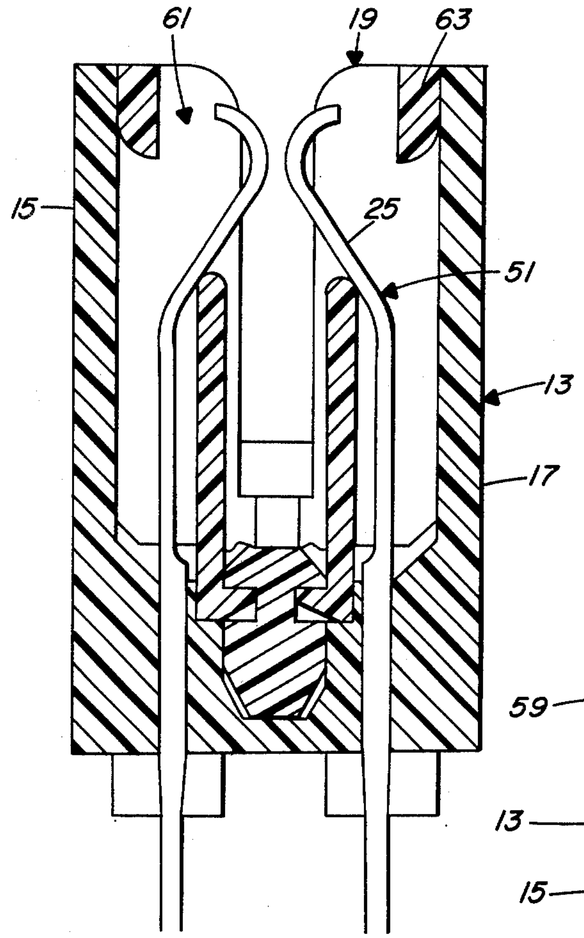
FIG. 2 is a cross-sectional view in section showing the connector in a closed position.
Figure 3:
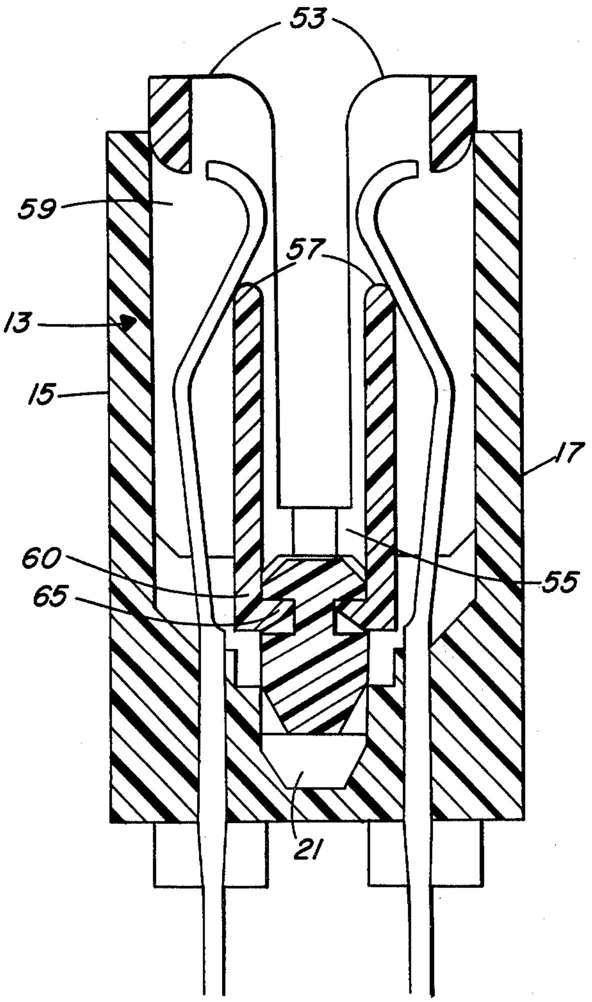
FIG. 3 is a cross-sectional view showing the connector in a receiving position.

The cam 31 includes a slot 47 along the length thereof. A protrusion 49 in the form of a pin secured to outer housing 13 is provided in the slot 47 for limiting the movement of the cam 31 in a longitudinal direction. As illustrated in the drawings, the slot 47 and protrusion 49 arrangement are provided at either end of the cam 31. The movement of the cam 31 is limited to movement between a first position or closed position as illustrated in FIG. 2 and a second or open position as illustrated in FIG. 3. In the closed position, the bottom surface 41 of the cam 23 is substantially adjacent the bottom surface of the channel 21 along its entire length. In the open position, the cam 23 is moved transversely away from the bottom surface of the channel 21 so that level portion 39 of the ramps 37 are in contact with the bottom surface 41 of cam 31.

An inner housing 51 is positioned interior the opening 19 includes a pair of upright sections 53 which form a zone for receiving a circuit board. The ends of the inner housing 51 are opened to permit insertion of the circuit board therethrough. The upright sections 53 are joined by a lower elongated section which is adjacent the top surface of cam 31. Each of the upright sections 53 include portions 57 for abutting the bowed ends 25 of the contacts 23. As the abutting portions 57 move upwardly against the adjacent inclined inwardly bowed sections 25, the bowed sections 25 and hence the contact are moved apart.

Partitions 59 connected to the lower elongated sections 55 extend widthwise across opening 19 on either side of the circuit board receiving zone. The partitions 59 act as spacers to prevent short circuiting of the contacts 23. The abutting portions 57 are intermediate the partitions 59 and are joined thereto. The abutting portion 57 and partitions 59 form recesses for accommodating respective contacts 23. An integral structure is formed by joining the partitions 59 at the top thereof by molded cross-sections 63.

Each of the upright sections 53 include a cam follower or flange 65 projecting interior respective grooves 33 for providing positive engagement with cam 31. The abutting portions 57 bridge the partitions and include lower sections 60 which extend below the bottom of the partitions 59. An inwardly facing flange 65 is provided at the lower end and projects into respective grooves 33. The downward extending lower sections 60 are adapted to be resiliently biased outwardly to accommodate the top section of the cam 31 and spring inwardly for insertion of the flanges 65 into the respective grooves 33. In operation, the cam 31 is urged in an axial or longitudinal direction by an external force applied at an end thereof. As the cam moves longitudinally in the channel 21 it is urged upwardly in a transverse direction by the ramps 35. When the mating level surface 35 of the cam engages a level surface of the ramp 35, further lateral movement is restricted by the slot 47 and protrusion 49. In this position, it is not necessary to maintain a force on the end of the cam since the cam will be positively retained in this position. As the cam 31 moves upwardly the upright sections 53 also moves upwardly causing the abutting portions 57 to urge the contacts 23 outwardly. With the contacts 23 held in an open position, a circuit board may be easily installed into the receiving zone. The contacts are then returned into a closed position by moving the cam 31 in the opposite direction. Due to the fact that the cam follower or flanges 65 are positioned in groove 33, the upright sections are moved downwardly without relying solely on the downward pressure created by the inward biasing of the bridging sections 25.

While the invention has been described herein with reference to certain embodiment, it is to be understood that there are various changes and modifications that can be made by those skilled in the art without departing from the concept of the invention, the scope of which is to be determined by reference to the following claims.

What is claimed is:

1. A low insertion force connector for making electrical connection between a circuit board and an external circuit comprising an elongated outer housing having a centrally located opening with a channel extending longitudinally along the bottom thereof, said channel including a plurality of outwardly facing ramps along the length thereof, a plurality of contacts mounted on said housing on either side of said channel, said contacts having end portions interior said opening and bowed inwardly for contacting a circuit board and opposite end portions projecting exterior of said outer housing for making electrical contact with an external circuit, an elongated cam having a longitudinal groove on either side thereof and a bottom surface configured to mate with said ramps and adapted to be actuated in a longitudinal direction for movement in a transverse direction, an inner housing interior said opening includes cam follower means projecting interior said grooves for providing positive engagement therewith and transverse movement corresponding to the transverse movement of said cam, said inner housing including a pair of upright sections forming a zone for receiving the circuit board, each of said upright sections including means for abutting bowed portions on respective sides of said channel and being adapted to urge said bowed portions to a position disengaged from said circuit board when said cam is actuated.

2. A low insertion force connector according to claim 1 wherein said cam includes a slot therein and a protrusion secured to said outer housing in said slot for limiting the movement of said cam in a longitudinal direction.

3. A low insertion force connector according to claim 2 wherein said ramps include an inclined portion, said cam having a matching inclined portion adapted to slide upwardly along said incline portion, said ramp including a level portion at the upper end of said incline portion and said cam having a mating level surface at the lower end of said matching inclined surface, said level surface and mating level surface being engageable for providing for positive retention of said cam in said position.

4. A low insertion force connector according to claim 3 wherein said portrusion comprises a pin secured to said outer housing and extends through said slot in said channel.

5. A low insertion force connector according to claim 1 wherein both of said inner and outer housings are open at least at one end to permit insertion of a circuit board therethrough.

6. A low insertion force connector according to claim 1 wherein said inner housing includes a lower elongated section with said upright sections connected to either side thereof.

7. A low insertion force connector according to claim 6 wherein each of said upright sections include a plurality of partitions having recesses therebetween for accommodating said contacts.

8. A low insertion force connector according to claim 7 wherein said partitions are connected to said lower elongated section, said abutting means bridge said partitions.

9. A low insertion force connector according to claim 8 wherein said abutting means includes lower sections extending downwardly on either side of said elongated cam, each bridging section including a flange portion for engaging a respective groove.

10. A low insertion force connector according to claim 9 wherein said lower sections are adapted to be resiliently biased outward for insertion of the flange portion into respective grooves.

* * * * *